US011799270B2

(12) United States Patent
Morohashi et al.

(10) Patent No.: US 11,799,270 B2
(45) Date of Patent: Oct. 24, 2023

(54) SEMICONDUCTOR OPTICAL ELEMENT, SEMICONDUCTOR OPTICAL ELEMENT FORMING STRUCTURE, AND METHOD OF MANUFACTURING SEMICONDUCTOR OPTICAL ELEMENT USING THE SAME

(71) Applicants: Fujikura Ltd., Tokyo (JP); OPTOENEGY Inc., Chiba (JP)

(72) Inventors: Rintaro Morohashi, Chiba (JP); Ryozaburo Nogawa, Chiba (JP); Tomoaki Koui, Chiba (JP); Yumi Yamada, Chiba (JP)

(73) Assignees: Fujikura Ltd., Tokyo (JP); OPTOENEGY Inc., Chiba (JP)

( * ) Notice: Subject to any disclaimer, the term of this patent is extended or adjusted under 35 U.S.C. 154(b) by 0 days.

(21) Appl. No.: 17/829,816

(22) Filed: Jun. 1, 2022

(65) Prior Publication Data

US 2022/0294188 A1    Sep. 15, 2022

Related U.S. Application Data

(63) Continuation of application No. 16/971,552, filed as application No. PCT/JP2019/006689 on Feb. 22, 2019, now Pat. No. 11,387,628.

(30) Foreign Application Priority Data

Mar. 13, 2018    (JP) .................................. 2018-046082

(51) Int. Cl.
*H01S 5/00*    (2006.01)
*H01S 5/30*    (2006.01)
(Continued)

(52) U.S. Cl.
CPC .......... *H01S 5/3054* (2013.01); *H01S 5/2004* (2013.01); *H01S 5/2231* (2013.01);
(Continued)

(58) Field of Classification Search
CPC .... H01S 5/3054; H01S 5/2004; H01S 5/2231; H01S 5/3063; H01S 5/3077; H01S 5/343; H01S 5/2206; H01S 2304/04
See application file for complete search history.

(56) References Cited

U.S. PATENT DOCUMENTS 5,557,627 A * 9/1996 Schneider, Jr ......... B82Y 20/00
                                                    372/50.12
5,949,807 A * 9/1999 Fujimoto .................. H01S 5/20
                                                    372/45.01
(Continued)

FOREIGN PATENT DOCUMENTS

CN        1925180 A      3/2007
JP     H10-256647 A      9/1998
(Continued)

OTHER PUBLICATIONS

Office Action issued in corresponding Chinese Application No. 201980005447.9 dated Jul. 29, 2022 (19 pages).
(Continued)

*Primary Examiner* — Kinam Park
(74) *Attorney, Agent, or Firm* — Osha Bergman Watanabe & Burton LLP

(57) ABSTRACT

A semiconductor optical element includes: a first conductivity type semiconductor substrate; and a laminated body disposed on the first conductivity type semiconductor substrate. The laminated body includes, in the following order from a side of the first conductivity type semiconductor substrate: a first conductivity type semiconductor layer; an active layer; a second conductivity type semiconductor layer; and a second conductivity type contact layer. The second conductivity type semiconductor layer includes: a carbon-doped semiconductor layer in which carbon is doped as a dopant in a compound semiconductor; and a group 2 element-doped semiconductor layer in which a group 2
(Continued)

element is doped as a dopant in a compound semiconductor. The carbon-doped semiconductor layer is disposed at a position closer to the active layer than the group 2 element-doped semiconductor layer.

16 Claims, 6 Drawing Sheets

(51) Int. Cl.
  *H01S 5/343*      (2006.01)
  *H01S 5/20*       (2006.01)
  *H01S 5/223*      (2006.01)
  *H01S 5/22*       (2006.01)

(52) U.S. Cl.
  CPC .......... *H01S 5/3063* (2013.01); *H01S 5/3077* (2013.01); *H01S 5/343* (2013.01); *H01S 5/2206* (2013.01); *H01S 2304/04* (2013.01)

(56) References Cited

U.S. PATENT DOCUMENTS

| | | | |
|---|---|---|---|
| 7,149,236 B1 | 12/2006 | Verma et al. | |
| 2003/0016712 A1* | 1/2003 | Matsumoto | H01S 5/2231 372/45.01 |
| 2004/0240025 A1* | 12/2004 | Bour | B82Y 20/00 359/241 |
| 2005/0058169 A1* | 3/2005 | Onishi | H01S 5/34326 372/44.01 |
| 2007/0045651 A1* | 3/2007 | Suzuki | H01L 33/02 257/97 |
| 2007/0291809 A1* | 12/2007 | Shiota | H01S 5/305 438/31 |
| 2008/0212636 A1* | 9/2008 | Sato | H01S 5/18311 257/E33.001 |
| 2010/0195685 A1* | 8/2010 | Taniguchi | H01S 5/164 372/45.01 |
| 2011/0114916 A1* | 5/2011 | Yoshizumi | B82Y 20/00 257/E31.032 |
| 2015/0180203 A1* | 6/2015 | Kinugawa | H01S 5/162 372/45.01 |

FOREIGN PATENT DOCUMENTS

| | | |
|---|---|---|
| JP | H11-004044 A | 1/1999 |
| JP | 2005-175450 A | 6/2005 |
| JP | 2006-128151 A | 5/2006 |
| JP | 2006-229012 A | 8/2006 |
| JP | 2007-88132 A | 4/2007 |
| JP | 2007317926 A | 12/2007 |
| JP | 2009-188435 A | 8/2009 |
| JP | 2010258283 A | 11/2010 |
| JP | 2011151240 A | 8/2011 |
| KR | 2002-0007972 A | 1/2002 |

OTHER PUBLICATIONS

International Preliminary Report on Patentability issued in corresponding International Application No. PCT/JP2019/006689 dated Sep. 24, 2020 (19 pages).
Extended European Search Report issued in corresponding European Application No. 19766761.1 dated Sep. 28, 2021 (8 pages).
Pietro Della Casa et al. "CBr4-based in-situ etching of GaAs, assisted with TMAl and TMGa" Journal of Crystal Growth, Available online Nov. 12, 2015, vol. 434, pp. 116-122 (8 pages).
Notice of Reasons for Refusal issued in corresponding Japanese Application No. 2020-505724 dated Nov. 30, 2021 (5 pages).
Decision of Refusal issued in corresponding Japanese Application No. 2020-505724 dated May 24, 2022 (4 pages).

\* cited by examiner

SEMICONDUCTOR OPTICAL ELEMENT, SEMICONDUCTOR OPTICAL ELEMENT FORMING STRUCTURE, AND METHOD OF MANUFACTURING SEMICONDUCTOR OPTICAL ELEMENT USING THE SAME

CROSS-REFERENCE TO RELATED APPLICATIONS

The present application is a continuation application of and, thereby, claims benefit under 35 U.S.C. § 120 to U.S. patent application Ser. No. 16/971,552 filed on Aug. 20, 2020, titled "SEMICONDUCTOR OPTICAL ELEMENT, SEMICONDUCTOR OPTICAL ELEMENT FORMING STRUCTURE, AND METHOD FOR MANUFACTURING SEMICONDUCTOR OPTICAL ELEMENT USING THE SAME," which claims benefit to International Patent Application No. PCT/JP2019/006689, filed on Feb. 22, 2019, which claims priority to Japanese Patent Application No. 2018-046082, filed on Mar. 13, 2018. The contents of the priority applications are incorporated by reference in their entirety.

TECHNICAL FIELD

The present invention relates to a semiconductor optical element, a semiconductor optical element forming structure, and a method of manufacturing a semiconductor optical element using the same.

BACKGROUND

As a semiconductor optical element, for example, a laser diode described in the following patent document 1 is conventionally known. In the following patent document 1, it is suggested to prevent carbon from diffusing into an adjacent layer due to heat and to lower a threshold current density to prolong the life of a laser diode by using carbon as a p-type dopant of a p-type compound semiconductor clad layer in the laser diode having an active layer between a n-type compound semiconductor clad layer and the p-type compound semiconductor clad layer.

However, the laser diode described in the above-mentioned patent document 1 has had the following issues.

That is, in the laser diode described in the above-mentioned patent document 1, there were some cases where the crystallinity of the p-type compound semiconductor clad layer (hereinafter, sometimes referred to as a "p-type clad layer") is lowered. Therefore, the laser diode described in the above-mentioned patent document 1 has had room for improvement in terms of light emission characteristics.

PATENT LITERATURE

Patent Document 1: JPH11-4044 A

SUMMARY

One or more embodiments of the present invention provide a semiconductor optical element capable of improving light emission characteristics, a semiconductor optical element forming structure, and a method of manufacturing a semiconductor optical element using the same.

The reason why the laser diode described in the above-mentioned patent document 1 has room for improvement in terms of light emission characteristics is considered as follows:

First, in a case of manufacturing a GaAs-based semiconductor laser by an organic metal vapor phase growth method (MOCVD method), a halomethane raw material such as $CBr_4$ (carbon bromide) or $CCl_4$ (chlorine bromide) is used as a carbon raw material for carbon doping. These halomethanes have an etching action on GaAs-based crystals. For this reason, it is known that a defect is introduced during crystal growth, and growth of a semiconductor layer having good crystallinity becomes difficult (see P. D. Casa et al. Journal of Crystal Growth, Vol. 434, 116). It is considered that the influence of the etching action on the lowering of crystallinity of the p-type clad layer becomes remarkable since the higher the concentration of the carbon dopant in the stacked semiconductor layer becomes, the greater the amount of the halomethane raw material used becomes. For example, in a case where a p-type clad layer having a thickness of more than 2 μm is laminated on an active layer, it is considered that it is difficult to grow a highly crystalline semiconductor layer. As a result, the p-type clad layer is considered to bring a large adverse effect on light emission characteristics, such as lowering of light emission efficiency and deterioration of long-term reliability. Accordingly, the inventors have conducted intensive studies repeatedly to deal with the above-mentioned issues. As a result, the inventors have noticed that there is a correlation between the fact that the crystallinity of the p-type clad layer is lowered and the occurrence of roughness on the surface of the laser diode. Furthermore, the inventors have noticed that, in a case where the thickness of a p-type clad layer where carbon is doped into a compound semiconductor as a dopant is small, roughness is hardly generated on the surface of the laser diode, and in a case where the thickness of the p-type clad layer is increased, roughness is likely to occur on the surface of the laser diode. Furthermore, the inventors have found that the above-mentioned issues can be dealt with by constituting, for example, a p-type clad layer to have a carbon-doped p-type semiconductor layer doped with carbon and a group 2 element-doped p-type semiconductor layer doped with a group 2 element, and suppressing the thickness of the carbon-doped p-type semiconductor layer while maintaining the required thickness of the p-type clad layer and arranging the carbon-doped p-type semiconductor layer at a position closer to the active layer than that of the group 2 element-doped p-type semiconductor layer.

That is, the present invention is a semiconductor optical element comprising a first conductivity type semiconductor substrate and a laminated body provided on the first conductivity type semiconductor substrate, the laminated body including a first conductivity type semiconductor layer, an active layer, a second conductivity type semiconductor layer, and a second conductivity type contact layer laminated sequentially from a side of the first conductivity type semiconductor substrate, in which the second conductivity type semiconductor layer includes a carbon-doped second conductivity type semiconductor layer where carbon is doped as a dopant in a compound semiconductor and a group 2 element doped second conductivity type semiconductor layer where a group 2 element is doped as a dopant in a compound semiconductor, and in which the carbon-doped second conductivity type semiconductor layer is disposed at a position closer to the active layer than the group 2 element-doped second conductivity type semiconductor layer.

In this semiconductor optical element, the second conductivity type semiconductor layer includes a carbon-doped second conductivity type semiconductor layer where carbon is doped as a dopant in a compound semiconductor, and a group 2 element-doped second conductivity type semiconductor layer where a group 2 element is doped as a dopant in a compound semiconductor, and the carbon-doped second conductivity type semiconductor layer is arranged at a position closer to the active layer than the group 2 element-doped second conductivity type semiconductor layer. For this reason, according to the semiconductor optical element of the present invention, as compared with a case where the second conductivity type semiconductor layer is composed of only the carbon-doped second conductivity type semiconductor layer, the thickness of the carbon-doped second conductivity type semiconductor layer can be reduced while maintaining the required thickness of the second conductivity type semiconductor layer, and crystallinity of the second conductivity type semiconductor layer can be improved. Therefore, the semiconductor optical element of the present invention can improve light emission characteristics.

In the above-mentioned semiconductor optical element, the second conductivity type contact layer may be composed of a carbon-doped second conductivity type contact layer where carbon is doped as a dopant in a compound semiconductor.

In this case, the dopant is carbon in the carbon-doped second conductivity type contact layer, and the carbon has a diffusion coefficient smaller than that of the group 2 element. Therefore, even if the dopant concentration is increased in the carbon-doped second conductivity type contact layer, diffusion of the dopant into the active layer can be sufficiently suppressed. Accordingly, the carbon can be doped with a higher concentration than the group 2 element, and the resistance of the carbon-doped second conductivity type contact layer can be lowered.

In the above-mentioned semiconductor optical element, a concentration of the dopant in the second conductivity type contact layer may be higher than a concentration of the dopant in the carbon-doped second conductivity type semiconductor layer.

In this case, the dopant concentration in the carbon-doped second conductivity type semiconductor layer is lower than the concentration of the dopant in the second conductivity type contact layer, and the dopant is carbon. Therefore, compared with the case where the dopant concentration in the second conductivity type contact layer is equal to or less than the dopant concentration in the carbon-doped second conductivity type semiconductor layer, the crystallinity can be further improved in the carbon-doped second conductivity type semiconductor layer bringing a larger effect on the light emission characteristic than the second conductivity type contact layer bringing less influence on the light emission characteristic. Further, the resistance of the second conductivity type contact layer can be further lowered. Accordingly, the light emission characteristics of the semiconductor optical element can be further improved.

In the above-mentioned semiconductor optical element, a ratio of the thickness of the group 2 element-doped second conductivity type semiconductor layer in the thickness of the second conductivity type semiconductor layer may be more than 50% and less than 100%.

This semiconductor element can further improve the crystallinity of the second conductivity type semiconductor layer in comparison with the case where the ratio of the thickness of the group 2 element-doped second conductivity type semiconductor layer in the thickness of the second conductivity type semiconductor layer is 50% or less. Therefore, the semiconductor optical element of the present invention can further improve light emission characteristics.

In the above-mentioned semiconductor optical element, the maximum concentration of the dopant in the group 2 element-doped second conductivity type semiconductor layer may be larger than the maximum concentration of the dopant in the carbon-doped second conductivity type semiconductor layer.

This semiconductor optical element can lower the resistance of the second conductivity type semiconductor layer while further improving the crystallinity of the second conductivity type semiconductor layer, as compared with the case where the maximum concentration of the dopant in the group 2 element-doped second conductivity type semiconductor layer is equal to or less than the maximum concentration of the dopant in the carbon-doped second conductivity type semiconductor layer. Therefore, the semiconductor optical element of the present invention can further improve light emission characteristics.

In the above-mentioned semiconductor optical element, the group 2 element-doped second conductivity type semiconductor layer may include a graded layer where a concentration of the dopant increases as a distance from the active layer increases.

In this case, the diffusion of the dopant into the active layer in the use of the semiconductor optical element can be suppressed while the resistance value of the group 2 element-doped second conductivity type semiconductor layer is lowered, and the light emission characteristics can be further improved.

Moreover, the present invention is a semiconductor optical element forming structure, comprising a first conductivity type semiconductor wafer and a laminated body provided on the first conductivity type semiconductor wafer, the laminated body including a first conductivity type semiconductor layer, an active layer, a second conductivity type semiconductor layer, and a second conductivity type contact layer laminated sequentially from a side of the first conductivity type semiconductor wafer, in which the second conductivity type semiconductor layer includes a carbon-doped second conductivity type semiconductor layer where carbon is doped as a dopant in a compound semiconductor, and a group 2 element-doped second conductivity type semiconductor layer where a group 2 element is doped as a dopant in a compound semiconductor, and in which the carbon-doped second conductivity type semiconductor layer is disposed at a position closer to the active layer than the group 2 element-doped second conductivity type semiconductor layer.

In the above-mentioned semiconductor optical element forming structure, the second conductivity type semiconductor layer includes a carbon-doped second conductivity type semiconductor layer where carbon is doped as a dopant in a compound semiconductor, and a group 2 element-doped second conductivity type semiconductor layer where a group 2 element is doped as a dopant in a compound semiconductor, and the carbon-doped second conductivity type semiconductor layer is arranged at a position closer to the active layer than the group 2 element-doped second conductivity type semiconductor layer. Therefore, according to the semiconductor optical element forming structure of the present invention, as compared with the case where the second conductivity type semiconductor layer is composed of only the carbon-doped second conductivity type semiconductor layer, the thickness of the carbon-doped second conductivity type semiconductor layer can be reduced while maintaining the required thickness of the second conductivity type semiconductor layer, and crystallinity of the second conductivity type semiconductor layer can be improved. Therefore, according to the semiconductor optical element forming structure of the present invention, a semiconductor optical element capable of improving light emission characteristics can be formed.

In the above-mentioned semiconductor optical element forming structure, the second conductivity type contact layer may be composed of a carbon-doped second conductivity type contact layer where carbon is doped as a dopant in a compound semiconductor.

In this case, the carbon has a diffusion coefficient smaller than that of the group 2 element. Therefore, even if the dopant concentration is increased in the carbon-doped second conductivity type contact layer, diffusion of the dopant into the active layer can be sufficiently suppressed. Accordingly, the carbon can be doped with a higher concentration than the group 2 element, and the resistance of the carbon-doped second conductivity type contact layer can be lowered.

In the above-mentioned semiconductor optical element forming structure, a concentration of the dopant in the second conductivity type contact layer may be higher than a concentration of the dopant in the carbon-doped second conductivity type semiconductor layer.

In this case, the concentration of the dopant in the carbon-doped second conductivity type semiconductor layer is lower than the concentration of the dopant in the second conductivity type contact layer, and the dopant is carbon. Therefore, compared with the case where the concentration of the dopant in the second conductivity type contact layer is less than or equal to the concentration of the dopant in the carbon-doped second conductivity type semiconductor layer, the crystallinity can be further improved in the carbon-doped second conductivity type semiconductor layer bringing a larger effect on the light emission characteristics than the second conductivity type contact layer bringing less influence on the light emission characteristics. Further, the resistance of the second conductivity type contact layer can be further lowered. Accordingly, a semiconductor optical element capable of further improving light emission characteristics can be formed.

In the above-mentioned semiconductor optical element forming structure, a ratio of the thickness of the group 2 element-doped second conductivity type semiconductor layer in the thickness of the second conductivity type semiconductor layer may be more than 50% and less than 100%.

The semiconductor optical element forming structure can further improve the crystallinity of the second conductivity type semiconductor layer in comparison with the case where the ratio of the thickness of the group 2 element-doped second conductivity type semiconductor layer in the thickness of the second conductivity type semiconductor layer is 50% or less. Therefore, according to the semiconductor optical element forming structure, a semiconductor optical element capable of further improving light emission characteristics can be manufactured.

In the above-mentioned semiconductor optical element forming structure, the maximum concentration of the dopant in the group 2 element-doped second conductivity type semiconductor layer may be larger than the maximum concentration of the dopant in the carbon-doped second conductivity type semiconductor layer.

According to the semiconductor optical element forming structure, as compared with the case where the maximum concentration of the dopant in the group 2 element-doped second conductivity type semiconductor layer is equal to or less than the maximum concentration of the dopant in the carbon-doped second conductivity type semiconductor layer, the resistance of the second conductivity type semiconductor layer can be lowered while further improving the crystallinity of the second conductivity type semiconductor layer. Accordingly, the semiconductor optical element forming structure of the present invention can manufacture a semiconductor optical element capable of further improving light emission characteristics.

In the above-mentioned semiconductor optical element forming structure, the group 2 element-doped second conductivity type semiconductor layer may include a graded layer where a concentration of the dopant increases as a distance from the active layer increases.

In this case, it is possible to manufacture a semiconductor optical element capable of suppressing the diffusion of the dopant into the active layer at the time of use while lowering the resistance value of the group 2 element-doped second conductivity type semiconductor layer, and further improving light emission characteristics.

The present invention is also a method of manufacturing the above-described semiconductor optical element, including a structure preparation step of preparing the above-described semiconductor optical element forming structure, and a semiconductor optical element formation step of forming the semiconductor optical element from the semiconductor optical element forming structure, in which the structure preparation step includes: a second conductivity type semiconductor layer formation step of forming the second conductivity type semiconductor layer on the active layer; and a second conductivity type contact layer formation step of forming the second conductivity type contact layer on the second conductivity type semiconductor layer, and in which the second conductivity type semiconductor layer formation step includes a carbon-doped second conductivity type semiconductor layer formation step of forming the carbon-doped second conductivity type semiconductor layer on the active layer; and a group 2 element-doped second conductivity type semiconductor layer formation step of forming the second conductivity type semiconductor layer by forming the group 2 element-doped second conductivity type semiconductor layer on the carbon-doped second conductivity type semiconductor layer.

According to this manufacturing method, in the obtained semiconductor optical element, the second conductivity type semiconductor layer has a carbon-doped second conductivity type semiconductor layer where carbon is doped as a dopant in a compound semiconductor, and a group 2 element-doped second conductivity type semiconductor layer where a group 2 element is doped as a dopant in a compound semiconductor, and the carbon-doped second conductivity type semiconductor layer is arranged at a position closer to the active layer than the group 2 element-doped second conductivity type semiconductor layer. Therefore, in the obtained semiconductor optical element, as compared with the case where the second conductivity type semiconductor layer is composed of only the carbon-doped second conductivity type semiconductor layer, the thickness of the carbon-doped second conductivity type semiconductor layer can be reduced while maintaining the required thickness of the second conductivity type semiconductor layer, and crystallinity of the second conductivity type semiconductor layer can be improved. Therefore, a semiconductor optical element capable of improving light emission characteristics can be manufactured.

Further, carbon has a diffusion coefficient smaller than that of the group 2 element. For this reason, even if the group 2 element-doped second conductivity type semiconductor layer is formed after the carbon-doped second conductivity type semiconductor layer is formed, diffusion of the group 2 element into the active layer through the carbon-doped second conductivity type semiconductor layer due to heat generated in forming the group 2 element-doped second conductivity type semiconductor layer is sufficiently suppressed. Further, in the above-mentioned manufacturing method, the second conductivity type semiconductor layer includes a carbon-doped second conductivity type semiconductor layer and a group 2 element-doped second conductivity type semiconductor layer. For this reason, the thickness of the carbon-doped second conductivity type semiconductor layer can be suppressed as compared with the case where the second conductivity type semiconductor layer is composed of only the carbon-doped second conductivity type semiconductor layer. Therefore, when carbon halide is used in forming the carbon-doped second conductivity type semiconductor layer, the amount of carbon halide used can be reduced. Therefore, it is sufficiently suppressed that surface roughness and the introduction of defects are caused by the etching action due to the carbon halide in the formed carbon-doped second conductivity type semiconductor layer. That is, the carbon-doped second conductivity type semiconductor layer can be formed on the active layer while maintaining high crystallinity. Therefore, according to the manufacturing method, a semiconductor optical element capable of sufficiently suppressing deterioration of light emission characteristics can be obtained.

In the above-mentioned manufacturing method of the semiconductor optical element, the second conductivity type contact layer formation step may include a step of forming a carbon-doped second conductivity type contact layer where carbon is doped as a dopant in a compound semiconductor as the second conductivity type contact layer on the second conductivity type semiconductor layer.

In this case, the dopant is carbon in the carbon-doped second conductivity type contact layer, and the carbon has a diffusion coefficient smaller than that of the group 2 element. Therefore, even if the dopant concentration is increased in the carbon-doped second conductivity type contact layer, diffusion of the dopant into the active layer can be sufficiently suppressed. Accordingly, the carbon can be doped with a higher concentration than the group 2 element, and the resistance of the carbon-doped second conductivity type contact layer can be lowered.

In the above-mentioned semiconductor optical element manufacturing method, in the second conductivity type contact layer formation step, the second conductivity type contact layer may be formed so that a concentration of the dopant in the second conductivity type contact layer is higher than a concentration of the dopant in the carbon-doped second conductivity type semiconductor layer.

In this case, the concentration of the dopant in the carbon-doped second conductivity type semiconductor layer is lower than the concentration of the dopant in the second conductivity type contact layer, and the dopant is carbon. Therefore, compared with the case where the dopant concentration in the second conductivity type contact layer is equal to or less than the dopant concentration in the carbon-doped second conductivity type semiconductor layer, the crystallinity can be further improved in the carbon-doped second conductivity type semiconductor layer bringing a larger effect on the light emission characteristic than the second conductivity type contact layer bringing less influence on the light emission characteristic. Further, the resistance of the second conductivity type contact layer can be further lowered. Accordingly, a semiconductor optical element capable of further improving light emission characteristics can be formed.

In the above-mentioned group 2 element-doped second conductivity type semiconductor layer formation step, the group 2 element-doped second conductivity type semiconductor layer may be formed so as to include a graded layer where a concentration of the dopant increases as a distance from the active layer increases.

In this case, it is possible to manufacture a semiconductor optical element capable of suppressing the diffusion of the dopant into the active layer in the formation or use of the group 2 element-doped second conductivity type semiconductor layer while reducing the resistance value of the group 2 element-doped second conductivity type semiconductor layer, and further improving the light emission characteristics.

In addition, in the present invention, the "first conductivity type" is a n-type or p-type, and the "second conductivity type" is a conductivity type different from the first conductivity type. For example, when the first conductivity type is n-type, the second conductivity type is p-type.

According to the present invention, a semiconductor optical element capable of improving light emission characteristics, a semiconductor optical element forming structure, and a method of manufacturing a semiconductor optical element using the same are provided.

DETAILED DESCRIPTION

[Semiconductor Optical Element]

Figure 1:
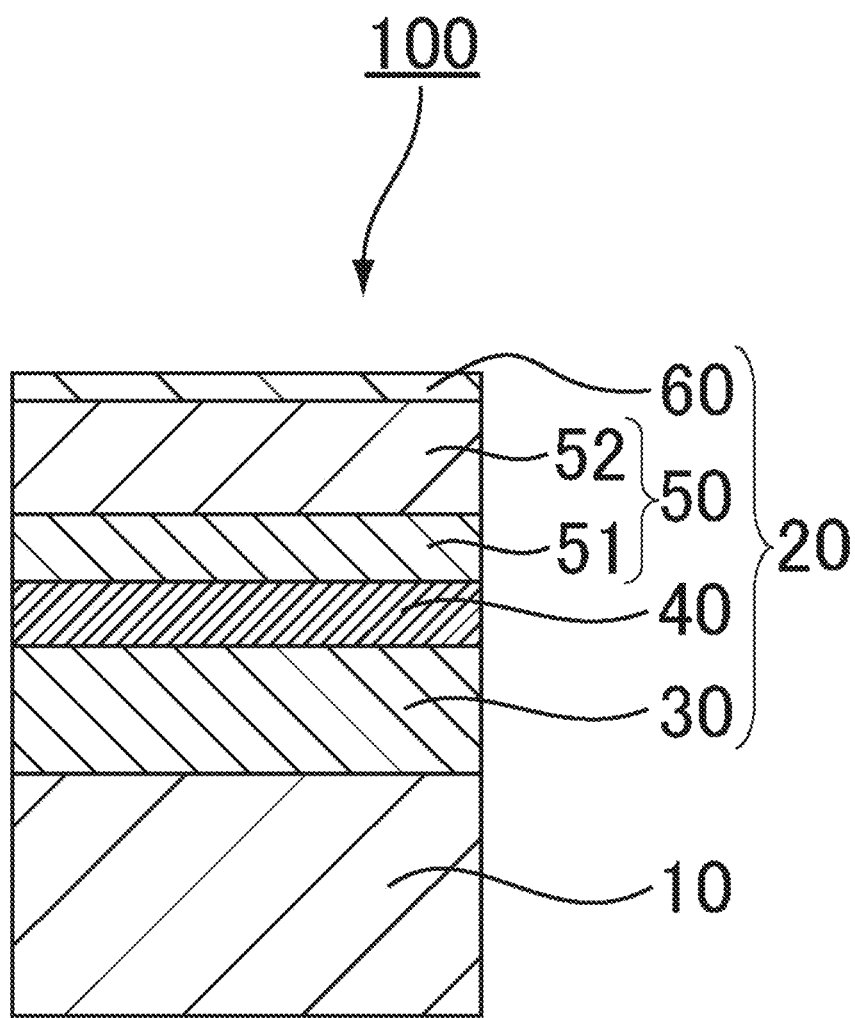
FIG. 1 is a cross-sectional view schematically showing a semiconductor optical element according to one or more embodiments of the present invention.

Hereinafter, one or more embodiments of the semiconductor optical element of the present invention will be described in detail with reference to FIG. 1. FIG. 1 is a cross-sectional view schematically showing a semiconductor optical element according to one or more embodiments of the present invention.

As shown in FIG. 1, a semiconductor optical element 100 includes a n-type semiconductor substrate 10 as a first conductivity type semiconductor substrate, and a laminated body 20 provided on the n-type semiconductor substrate 10. In the laminated body 20, a n-type semiconductor layer 30 as a first conductivity type semiconductor layer, an active layer 40, a p-type semiconductor layer 50 as a second conductivity type semiconductor layer, and a p-type contact layer 60 as a second conductivity type contact layer are laminated sequentially from the n-type semiconductor substrate 10 side. In addition, examples of the semiconductor optical element 100 includes, for example, a semiconductor laser element and a light-emitting diode. Further, in the semiconductor optical element 100, an electrode (not shown) may be provided on each of the n-type semiconductor substrate 10 and the laminated body 20.

The p-type semiconductor layer 50 includes a carbon-doped p-type clad layer 51 as a carbon-doped p-type semiconductor layer where carbon is doped as a dopant in a compound semiconductor, and a group 2 element-doped p-type clad layer 52 as a group 2 element-doped p-type semiconductor layer where a group 2 element is doped as a dopant in a compound semiconductor. In one or more embodiments, the carbon-doped p-type clad layer 51 is arranged at a position closer to the active layer 40 than the group 2 element-doped p-type clad layer 52. That is, the carbon-doped p-type clad layer 51 is disposed between the active layer 40 and the group 2 element-doped p-type clad layer 52, and the group 2 element-doped p-type clad layer 52 is disposed between the carbon-doped p-type clad layer 51 and the p-type contact layer 60.

In this semiconductor optical element 100, the p-type semiconductor layer 50 has a carbon-doped p-type clad layer 51 where carbon is doped as a dopant in a compound semiconductor, and a group 2 element-doped p-type clad layer 52 where a group 2 element is doped as a dopant in a compound semiconductor, and the carbon-doped p-type clad layer 51 is arranged at a position closer to the active layer 40 than the group 2 element-doped p-type clad layer 52. Therefore, according to the semiconductor optical element 100, as compared with the case where the p-type semiconductor layer 50 is composed of only the carbon-doped p-type clad layer 51, the thickness of the carbon-doped p-type clad layer 51 can be reduced while maintaining the required thickness of the p-type semiconductor layer 50, and crystallinity of the p-type semiconductor layer 50 can be improved. Therefore, the semiconductor optical element 100 can improve light emission characteristics. Further, according to the semiconductor optical element 100, since crystallinity of the p-type semiconductor layer 50 can be improved, long-term reliability of the semiconductor optical element 100 can also be improved.

Hereinafter, the n-type semiconductor substrate 10 and the laminated body 20 are described in detail.

<N-Type Semiconductor Substrate>

The n-type semiconductor substrate 10 includes a compound semiconductor and a dopant.

Examples of the compound semiconductor include a group III-V compound semiconductor such as GaAs and InP, for example.

Examples of the dopant include elements such as Si, Ge, Sn, S, Se and Te. These can be used alone or in combination of two or more kinds thereof.

The thickness of the n-type semiconductor substrate 10 is not particularly limited but is typically 250 to 450 μm.

<Laminated Body>

The laminated body 20 includes the n-type semiconductor layer 30, the active layer 40, the p-type semiconductor layer 50, and the p-type contact layer 60. The laminated body 20 includes a compound semiconductor. Examples of the compound semiconductor include GaAs, AlGaAs, InGaAs, InGaAlAs, InP, GaInP, AlInP, AlGaInP and InGaAsP, for example.

(N-Type Semiconductor Layer)

The n-type semiconductor layer 30 has, for example, a n-type waveguide layer and a n-type clad layer sequentially from the active layer 40 side. Here, the waveguide layer is a layer in which light propagates together with the active layer 40, and the clad layer is a layer for confining light so that it propagates in the active layer 40 and the waveguide layer.

The thickness of the n-type semiconductor layer 30 is not particularly limited but may be 2 to 4 μm.

The n-type semiconductor layer 30 includes a compound semiconductor and a dopant. The compound semiconductor may be the same as or different from the compound semiconductor contained in the n-type semiconductor substrate 10. As the dopant, the same dopant as the dopant in the n-type semiconductor substrate 10 can be used.

The n-type waveguide layer and the n-type clad layer can be composed of a layer having a constant dopant concentration, a graded layer in which a dopant concentration changes along a direction away from the n-type semiconductor layer 30, or a laminate of these.

(Active Layer)

The active layer 40 is a layer having a band gap smaller than the band gap of the n-type semiconductor layer 30 and the p-type semiconductor layer 50, and emitting light by applying a voltage.

The active layer 40 is composed of a laminate including a quantum well layer between two barrier layers, for example.

The quantum well layer includes a compound semiconductor. The compound semiconductor is appropriately selected according to the wavelength of light emitted from the semiconductor optical element 100. Examples of the compound semiconductor include InGaAs, GaAs, InGaAlAs, AlGaInP and InGaAsP.

The two barrier layers on both sides of the quantum well layer are layers including a compound semiconductor having a band gap larger than the band gap of the quantum well layer. The barrier layer may further include a dopant.

The barrier layer can be composed of a layer having a constant dopant concentration, a graded layer in which a dopant concentration changes as a distance from the quantum well layer increases, or a laminate of these. Alternatively, the barrier layer can be composed of a layer in which a composition of elements in a compound semiconductor is constant, a graded layer in which a composition of elements in a compound semiconductor changes along a direction away from the quantum well layer, or a laminate of these.

The thickness of the active layer 40 is not particularly limited but is usually 30 to 70 nm. Further, the active layer 40 may be a multiple quantum well structure in which a quantum well layer and a barrier layer are alternately laminated over a plurality of layers.

(P-Type Semiconductor Layer)

The p-type semiconductor layer 50 is a layer for confining light generated in the active layer 40 together with the n-type semiconductor layer 30, and has a p-type clad layer. The p-type semiconductor layer 50 may further include a p-type waveguide layer between the p-type clad layer and the active layer 40. The p-type semiconductor layer 50 has a carbon-doped p-type clad layer 51 and a group 2 element-doped p-type clad layer 52 as the p-type clad layer sequentially from the active layer 40 side.

The concentration of the dopant in the carbon-doped p-type clad layer 51 is not particularly limited but the concentration of the dopant may be $1 \times 10^{17}$ to $5 \times 10^{18}$ cm$^{-3}$. In this case, the optical loss in the semiconductor optical element 100 can be suppressed sufficiently, and the crystallinity of the carbon-doped p-type clad layer 51 can be maintained higher in comparison with the case where the concentration of the dopant is out of the above range. The concentration of the dopant in the carbon-doped p-type clad layer 51 may be $1\times10^{17}$ to $1\times10^{18}$ cm$^{-3}$.

The carbon-doped p-type clad layer 51 can be composed of a layer having a constant dopant concentration, a graded layer in which a dopant concentration increases as a distance from the active layer 40 increases, or a laminate of these. The carbon-doped p-type clad layer 51 may include the graded layer in which the dopant concentration increases as a distance from the active layer 40 increases. In this case, the resistance value of the carbon-doped p-type clad layer 51 can be reduced while suppressing an increase in optical loss in the vicinity of the active layer 40.

Examples of the group 2 element in the group 2 element-doped p-type clad layer 52 include zinc, magnesium, and beryllium.

The concentration of the dopant in the group 2 element-doped p-type clad layer 52 is not particularly limited but the concentration of the dopant may be $1\times10^{17}$ to $1.5\times10^{19}$ cm$^{-3}$. In this case, the reduction of the resistance value of the group 2 element-doped p-type clad layer 52 and the suppression of dopant diffusion into the active layer 40 can be achieved in comparison with the case where the dopant concentration is out of the above range. The concentration of the dopant in the group 2 element-doped p-type clad layer 52 may be $3\times10^{17}$ to $1.1\times10^{19}$ cm$^{-3}$.

The group 2 element-doped p-type clad layer 52 can be composed of a layer having a constant dopant concentration, a graded layer in which a dopant concentration increases as a distance from the active layer 40 increases, or a laminate thereof. The group 2 element-doped p-type clad layer 52 may include the graded layer in which the dopant concentration increases as the distance from the active layer 40 increases. In this case, the diffusion of the dopant into the active layer 40 in the use of the semiconductor optical element 100 can be suppressed while the resistance value of the group 2 element-doped p-type clad layer 52 is reduced, and the light emission characteristics can be further improved.

The group 2 element-doped p-type clad layer 52 may have a layer having a dopant concentration of $5\times10^{18}$ to $1.5\times10^{19}$ cm$^{-3}$. In this case, a better light emission characteristic can be obtained without causing an increase in the resistance of the semiconductor optical element 100 and an increase in the threshold current, as compared with the case where the dopant concentration is out of the above range.

The maximum concentration of the dopant in the group 2 element-doped p-type clad layer 52 may be larger than the maximum concentration of the dopant in the carbon-doped p-type clad layer 51 or may be equal to or less than the maximum concentration of the dopant in the carbon-doped p-type clad layer 51, but may be larger than the maximum concentration of the dopant in the carbon-doped p-type clad layer 51.

In this case, the resistance between the p-type contact layer 60 and an electrode (not shown) contacting the p-type contact layer 60 can be lowered while the crystallinity of the p-type semiconductor layer 50 are further improved, as compared with the case where the maximum concentration of the dopant in the group 2 element-doped p-type clad layer 52 is equal to or less than the maximum concentration of the dopant in the carbon-doped p-type clad layer 51. Therefore, the semiconductor optical element 100 can further improve light emission characteristics.

Here, the ratio of the maximum concentration of the dopant in the group 2 element-doped p-type clad layer 52 to the maximum concentration of the dopant in the carbon-doped p-type clad layer 51 has only to be larger than 1, but it may be 10 or more. In this case, the semiconductor optical element 100 can further improve light emission characteristics and long-term reliability.

However, the above-mentioned ratio may be 15 or less.

In the group 2 element-doped p-type clad layer 52, a current blocking layer having an opening for injecting a current and blocking current may be provided. In this case, the spread of the current can be suppressed, and as a result, the light emission mode is stabilized.

In the current blocking layer, the opening may be formed inside the outer peripheral edge of the current blocking layer when the active layer 40 and the current blocking layer are viewed in the thickness direction of the active layer 40.

In this case, a current can be supplied to an inner part of the active layer 40, and stable light emission can be performed in the semiconductor optical element 100. Here, the number of openings may be one or plural. The opening may be formed in a stripe shape.

The current blocking layer includes a compound semiconductor and a dopant. As the compound semiconductor and the dopant, a compound semiconductor and a dopant similar to those of the n-type semiconductor substrate 10 can be used.

The group 2 element-doped p-type clad layer 52 may further include a first layer in contact with the current blocking layer and provided on the active layer 40 side with respect to the current blocking layer. In the first layer, the concentration of the dopant (group 2 element) may be $5\times10^{17}$ cm$^{-3}$ or less. In this case, compared with the case where the concentration of the dopant (group 2 element) is out of the above range, occurrence of abnormal oscillation due to current spread can be suppressed more sufficiently in the semiconductor optical element 100.

The group 2 element-doped p-type clad layer 52 may further include a second layer provided on a side opposite to the active layer 40 of the current blocking layer. The second layer may have a thickness of 1 μm or more. In this case, when the semiconductor optical element 100 is mounted on one surface of a plate-like submount, with the p-type contact layer 60 directed toward one surface side of the submount and the light emission end face of the semiconductor optical element 100 retracted from an end face orthogonal to the one face of the submount, the thickness from the one surface of the submount to the active layer 40 can be sufficiently secured and the light emitted from the light emitting end face of the semiconductor optical element 100 is sufficiently suppressed from being interrupted by the submount. When the group 2 element-doped p-type clad layer 52 has a second layer in mounting the semiconductor optical element 100 on one surface of the submount by solder, an interval from the one surface of the submount to the active layer 40 is increased. Therefore, it is possible to sufficiently prevent the solder from connecting and short-circuiting the p-type semiconductor layer 50 and the n-type semiconductor layer 30.

The thickness of the second layer has only to be 1 μm or more but may be 1.2 μm or more. However, the thickness of the second layer may be 2.5 μm or less, and further 2 μm or less. In this case, the crystallinity of the second layer can be sufficiently improved in comparison with the case where the thickness of the second layer is out of each of the above ranges.

Further, the group 2 element-doped p-type clad layer 52 may further include a layer provided between the second layer and the current blocking layer and contacting the current blocking layer. In this layer, in order to prevent current from flowing between the layer and the current blocking layer, the concentration of the dopant (group 2 element) may be lower than the dopant concentration of the current blocking layer, and further half or less of the dopant concentration of the current blocking layer.

The ratio of the thickness of the group 2 element-doped p-type clad layer 52 in the thickness of the p-type semiconductor layer 50 may be greater than 50% and less than 100% or may be 50% or less, but may be greater than 50% and less than 100%.

In this case, the crystallinity of the p-type semiconductor layer 50 can be further improved in comparison with the case where the ratio of the thickness of the group 2 element-doped p-type clad layer 52 in the thickness of the p-type semiconductor layer 50 is 50% or less. Therefore, the semiconductor optical element 100 can further improve light emission characteristics.

However, in a case where the ratio of the thickness of the group 2 element-doped p-type clad layer 52 in the thickness of the p-type semiconductor layer 50 is larger than 50%, the ratio may be 75% or less.

Here, the thickness of the carbon-doped p-type clad layer 51 may be 2 μm or less. In this case, the crystallinity of the carbon-doped p-type clad layer 51 can be further improved in comparison with the case where the thickness of the carbon-doped p-type clad layer 51 exceeds 2 μm. The thickness of the carbon-doped p-type clad layer 51 may be 1.2 μm or less. However, the thickness of the carbon-doped p-type clad layer 51 may be 1 μm or more. In this case, compared with the case where the thickness of the carbon-doped p-type clad layer 51 is less than 1 μm, diffusion of the dopant of the group 2 element included in the group 2 element-doped p-type clad layer 52 laminated on the carbon-doped p-type clad layer 51 into the active layer 40 can be suppressed sufficiently.

The thickness of the p-type semiconductor layer 50 is not particularly limited but may be 4 μm or less. In this case, the crystallinity of the p-type semiconductor layer 50 can be further improved compared with the case in which the thickness of the p-type semiconductor layer 50 exceeds 4 μm. However, the thickness of the p-type semiconductor layer 50 may be 3 μm or more.

(P-Type Contact Layer)

The p-type contact layer 60 is a layer in contact with an electrode (not shown).

The p-type contact layer 60 includes a compound semiconductor and a dopant. As the compound semiconductor, a compound semiconductor similar to that of the group 2 element-doped p-type clad layer 52 can be used. Carbon may be used as the dopant. That is, the p-type contact layer 60 may be composed of a carbon-doped p-type contact layer in which carbon is doped as a dopant in a compound semiconductor. In this case, since the dopant is carbon in the p-type contact layer 60, the resistance of the p-type contact layer 60 can be reduced. In addition, since carbon has a diffusion coefficient smaller than that of the group 2 element, it is possible to sufficiently suppress diffusion of the dopant into the active layer 40 even if the dopant concentration is increased.

The dopant concentration is not particularly limited but from the viewpoint of sufficiently lowering contact resistance with the electrode, it may be $1 \times 10^{19}$ $cm^{-3}$ or more.

The dopant concentration in the p-type contact layer 60 may be higher than the dopant concentration in the carbon-doped p-type clad layer 51, or may be equal to or less than the dopant concentration in the carbon-doped p-type clad layer 51, but it may be higher than the dopant concentration in the carbon-doped p-type clad layer 51.

In this case, the dopant concentration in the carbon-doped p-type clad layer 51 is lower than the dopant concentration in the p-type contact layer 60. Therefore, compared with the case where the dopant concentration in the p-type contact layer 60 is equal to or less than the dopant concentration in the carbon-doped p-type clad layer 51, the crystallinity can be further improved in the carbon-doped p-type clad layer 51 bringing a larger effect on the light emission characteristics than the p-type contact layer 60 bringing a smaller effect on the light emission characteristics. In addition, the resistance in the p-type contact layer 60 can be further lowered. Accordingly, the light emission characteristics of the semiconductor optical element 100 can be further improved.

(N-Type Buffer Layer)

The laminated body 20 may further include a n-type buffer layer (not shown) between the n-type semiconductor substrate 10 and the n-type semiconductor layer 30.

The n-type buffer layer is provided to enhance crystallinity of the n-type semiconductor layer 30, and includes a compound semiconductor and a dopant.

As the compound semiconductor, a compound semiconductor similar to that of the compound semiconductor contained in the n-type semiconductor substrate 10 can be used. As the dopant as well, a dopant similar to the dopant contained in the n-type semiconductor substrate 10 can be used.

The dopant concentration in the n-type buffer layer may be smaller than the dopant concentration in the n-type semiconductor substrate 10 and smaller than the dopant concentration in the layer in contact with the n-type buffer layer of the n-type semiconductor layer 30. In this case, crystallinity of the n-type semiconductor layer 30 is further enhanced.

The thickness of the n-type buffer layer is not particularly limited as long as it is smaller than the thickness of the n-type semiconductor substrate 10, but is usually 300 to 1,000 nm.

<Use of Semiconductor Optical Element>

Since the semiconductor optical element 100 can improve light emission characteristics as described above, it is useful as a light source for use in a fiber laser or a medical laser (for example, a dental laser).

[Semiconductor Optical Element Forming Structure]

Figure 2:
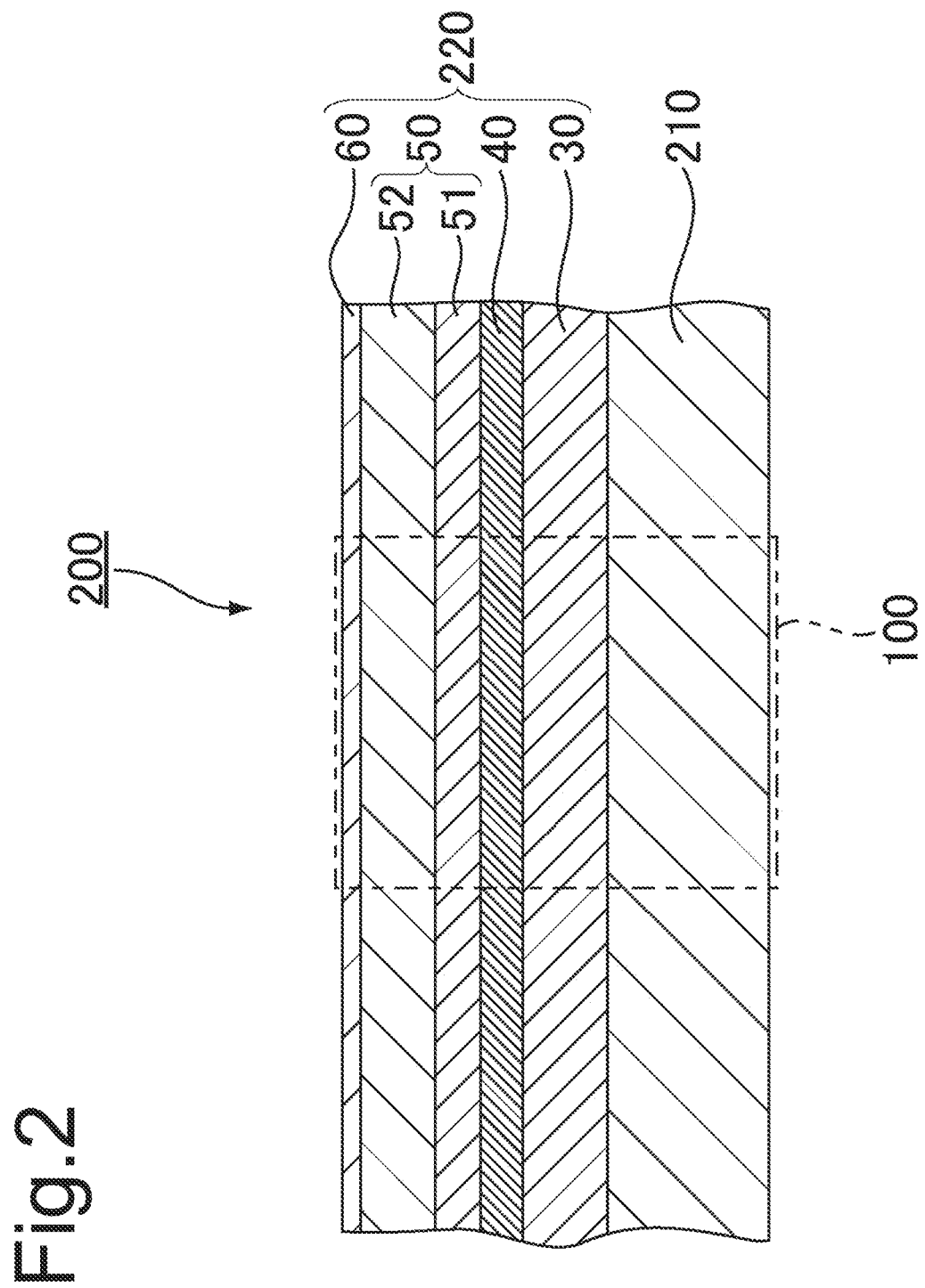
FIG. 2 is a partial cross-sectional view schematically showing a semiconductor optical element forming structure according to one or more embodiments of the present invention.

Next, a semiconductor optical element forming structure for forming the above-mentioned semiconductor optical element 100 will be described in detail with reference to FIG. 2. FIG. 2 is a partial cross-sectional view schematically showing a semiconductor optical element forming structure according to one or more embodiments of the present invention. In FIG. 2, the same or equivalent components as those of FIG. 1 are denoted by the same reference numerals, and redundant explanations are omitted.

As shown in FIG. 2, a structure 200 for forming a semiconductor optical element includes a n-type semiconductor wafer 210 as a first conductivity type semiconductor wafer and a laminated body 220 provided on the n-type semiconductor wafer 210.

The n-type semiconductor wafer 210 is composed of a material similar to that of the n-type semiconductor substrate 10.

In the laminated body 220, a n-type semiconductor layer 30, an active layer 40, a p-type semiconductor layer 50, and a p-type contact layer 60 are sequentially laminated from the n-type semiconductor wafer 210 side.

In the structure 200 for forming a semiconductor optical element, the p-type semiconductor layer 30 includes a carbon-doped p-type clad layer 51 where carbon is doped as a dopant in a compound semiconductor, and a group 2 element-doped p-type clad layer 52 where a group 2 element is doped as a dopant in a compound semiconductor. Therefore, according to the semiconductor optical element forming structure 200, as compared with the case where the p-type semiconductor layer 30 is composed of only the carbon-doped p-type clad layer, the thickness of the carbon-doped p-type clad layer 51 can be reduced while maintaining the required thickness of the p-type semiconductor layer 30, and crystallinity of the p-type semiconductor layer 30 can be improved. Therefore, according to the structure 200 for forming a semiconductor optical element, the semiconductor optical element 100 capable of improving light emission characteristics can be formed.

In order to obtain the semiconductor optical element 100 from the structure 200 for forming a semiconductor optical element, for example, the semiconductor optical element forming structure 200 may be stuck to an adhesive sheet or the like, and the semiconductor optical element forming structure 200 may be scratched and cleaved.

[Manufacturing Method of Semiconductor Optical Element]

Next, a manufacturing method of the above-mentioned semiconductor optical element 100 will be described with reference to FIG. 2. FIG. 2 is a partial cross-sectional view schematically showing a semiconductor optical element forming structure according to one or more embodiments of the present invention.

First, as shown in FIG. 2, a structure 200 for forming a semiconductor optical element is prepared (Structure Preparation Step).

For this purpose, a n-type semiconductor wafer 210 is prepared first. As the n-type semiconductor wafer 210, a n-type semiconductor wafer composed of the same material as the n-type semiconductor substrate 10 is prepared.

Next, after the n-type semiconductor layer 30 and the active layer 40 are formed on one surface of the n-type semiconductor wafer 210, the p-type semiconductor layer 50 is formed (Second Conductivity Type Semiconductor Layer Formation Step).

At this time, the p-type semiconductor layer 50 is formed by forming a carbon-doped p-type clad layer 51 on the active layer 40 (carbon-doped second conductivity type semiconductor layer formation step), and then forming a group 2 element-doped p-type clad layer 52 on the carbon-doped p-type clad layer 51 (group 2 element-doped second conductivity type semiconductor layer formation step).

Next, a p-type contact layer 60 is formed on the p-type semiconductor layer 50 (carbon-doped second conductivity type contact layer formation step).

Thus, the laminated body 220 is obtained.

At this time, the n-type semiconductor layer 30, the active layer 40, the p-type semiconductor layer 50, and the p-type contact layer 60 can be formed, for example, by a metal organic chemical vapor deposition (MOCVD: Metal Organic Chemical Vapor Deposition) method. At this time, as a raw material, a necessary raw material selected from trimethyl gallium (TMG), trimethylaluminum (TMA), trimethyl indium (TMI), arsine gas ($AsH_3$), halomethane such as carbon bromide ($CBr_4$) or carbon chloride ($CCl_4$), diethyl zinc (DEZ), monosilane ($SiH_4$), and the like may be used according to a material constituting each of the layers.

Thus, the semiconductor optical element forming structure 200 is obtained.

Next, after an electrode is formed on each of the n-type semiconductor wafer 210 of the semiconductor optical element forming structure 200 and the p-type contact layer 60 of the laminated body 220 if necessary, the semiconductor optical element forming structure 200 is stuck to an adhesive sheet or the like. Then, the semiconductor optical element forming structure 200 is scratched and cleaved, and separated into a plurality of semiconductor optical elements 100 to obtain a semiconductor optical element 100 (semiconductor optical element formation step).

Thus, the semiconductor optical element 100 is obtained.

When the semiconductor optical element 100 is manufactured as described above, in the obtained semiconductor element 100, the p-type semiconductor layer 50 includes a carbon-doped p-type clad layer 51 in which carbon is doped as a dopant in a compound semiconductor; and a group 2 element-doped p-type clad layer 52 which is provided between the p-type contact layer 60 and the carbon-doped p-type clad layer 51 and in which a group 2 element is doped as a dopant in a compound semiconductor. Therefore, according to the semiconductor optical element forming structure 200, compared with the case where the p-type semiconductor layer 50 is composed of only the carbon-doped p-type clad layer 51 where carbon is doped as a dopant in a compound semiconductor, the thickness of the carbon-doped p-type clad layer 51 can be reduced while maintaining the required thickness of the p-type semiconductor layer 50, and crystallinity of the p-type semiconductor layer 50 can be improved. Therefore, according to the above-mentioned manufacturing method, a semiconductor optical element 100 capable of improving light emission characteristics can be obtained. Further, according to the above-mentioned manufacturing method, since the crystallinity of the p-type semiconductor layer 50 can be improved in the obtained semiconductor optical element 100, the long-term reliability of the semiconductor optical element 100 can also be improved.

Further, in the above-mentioned manufacturing method, since the p-type semiconductor layer 50 includes a carbon-doped p-type clad layer 51 and a group 2 element-doped p-type semiconductor layer 52, the thickness of the carbon-doped p-type semiconductor layer 51 can be suppressed as compared with the case where the p-type semiconductor layer 50 is composed of only the carbon-doped p-type clad layer 51. Therefore, when halomethane such as carbon bromide ($CBr_4$) or carbon chloride ($CCl_4$) is used in forming the carbon-doped p-type clad layer 51, the amount of halomethane used can be reduced. Therefore, it is sufficiently suppressed that surface roughness and the introduction of defects in the formed carbon-doped p-type clad layer 51 is caused by the etching action due to the halomethane. That is, the carbon-doped p-type clad layer 51 can be formed on the active layer 40 while maintaining high crystallinity. Therefore, according to the above-mentioned manufacturing method, a semiconductor optical element 100 capable of sufficiently suppressing deterioration of light emission characteristics can be obtained.

In addition, in the case where the group 2 element-doped p-type clad layer 52 is formed on the carbon-doped p-type clad layer 51, the group 2 element-doped p-type clad layer 52 may be formed so as to include a graded layer where a dopant concentration increases as a distance from the active layer 40 increases.

In this case, while reducing the resistance value of the group 2 element-doped p-type clad layer 52, a semiconductor optical element 100 capable of suppressing diffusion of a dopant into the active layer 40 at the time of formation (annealing) of the group 2 element-doped p-type clad layer 52 and in use and further improving light emission characteristics can be manufactured.

The present invention is not limited to the above embodiments. For example, in the above-mentioned embodiments, the semiconductor optical element 100 has a n-type semiconductor layer 30, and the n-type semiconductor layer 30 has a n-type waveguide layer. However, the n-type semiconductor layer 30 may not have the n-type waveguide layer.

Further, in the above-mentioned embodiments, the current blocking layer is provided in the group 2 element-doped p-type clad layer 52, but the current blocking layer may be provided in the carbon-doped p-type clad layer 51.

Furthermore, in the above-mentioned embodiments, a current blocking layer is provided in the group 2 element-doped p-type clad layer 52, and a current stripe structure can be formed from the current blocking layer. However, instead of the current stripe structure, a ridge structure having a current injection region and a current non-injection region may be provided. In this case, a portion other than the current injection region becomes the current non-injection region. Here, the depth of the current non-injection region is not particularly limited and may be any depth. For example, in FIG. 6 according to Example 8, a portion from the carbon-doped p-type contact layer to the zinc-doped p-type clad layer is removed by etching, but the depth of the removed part by the etching may be a depth from the carbon-doped p-type contact layer to the middle of the zinc-doped p-type clad layer, or may be a depth from the carbon-doped p-type contact layer to the carbon-doped p-type clad layer.

EXAMPLES

Hereinafter, the contents of the present invention will be described more specifically by way of Examples, but the present invention is not limited to the following Examples.

Example 1

First, a n-type semiconductor wafer having a thickness of 350 μm and a diameter of 50 mm was prepared. At this time, as the n-type semiconductor wafer, a wafer where Si was doped in GaAs as a dopant in a concentration of $1.0 \times 10^{18}$ cm$^{-3}$ was used.

Next, a n-type buffer layer, a n-type semiconductor layer, an active layer, a p-type semiconductor layer, and a p-type contact layer were sequentially formed on one surface of the n-type semiconductor wafer to obtain a laminated body.

At this time, the n-type buffer layer was composed of a layer obtained by doping Si as a dopant in a concentration of $3 \times 10^{17}$ cm$^{-3}$ in GaAs and was formed to have a thickness of 500 nm. The n-type semiconductor layer was composed of a layer obtained by doping Si as a dopant in AlGaAs, and the n-type semiconductor layer was composed of a n-type clad layer and a n-type waveguide layer sequentially from the n-type semiconductor wafer side. The n-type clad layer is a layer in which a dopant concentration is reduced from $1.0 \times 10^{18}$ cm$^{-3}$ to $1.0 \times 10^{17}$ cm$^{-3}$ as a distance from the n-type semiconductor wafer increased, and the layer was formed so that a layer having a constant dopant concentration and a plurality of layers where dopant concentrations continuously change from those of adjacent layers had a total thickness of 3500 nm. The n-type waveguide layer was a layer in which a Si dopant concentration was increased from $5.0 \times 10^{16}$ cm$^{-3}$ to $5.0 \times 10^{17}$ cm$^{-3}$ as a distance from the n-type semiconductor wafer increased, and the layer was formed so that a layer having a constant dopant concentration and a plurality of layers where dopant concentrations continuously change from those of adjacent layers had a total thickness of 550 nm.

The active layer was composed of a first barrier layer, a quantum well layer, and a second barrier layer sequentially from the n-type semiconductor wafer side. At this time, a layer obtained by doping Si in AlGaAs was formed as the first barrier layer. The quantum well layer was formed so that a layer composed of an InGaAs layer has an In composition and a thickness with which a laser oscillation wavelength of 915 nm can be obtained. A layer made of AlGaAs was formed as the second barrier layer.

The p-type semiconductor layer was composed of a carbon-doped p-type clad layer and a zinc-doped p-type clad layer, and the zinc-doped p-type clad layer was formed to include a zinc-doped p-type first clad layer and a zinc-doped p-type second clad layer. The carbon-doped p-type clad layer was a layer in which an Al composition of AlGaAs was 50 mol % and a carbon dopant concentration was increased from $1.0 \times 10^{17}$ cm$^{-3}$ to $1.0 \times 10^{18}$ cm$^{-3}$ as a distance from the active layer increased, and the layer was formed so that a layer having a constant dopant concentration and a plurality of layers where dopant concentrations continuously changed from those of adjacent layers had a total thickness of 1050 nm. The zinc-doped p-type first clad layer was formed so that a layer obtained by doping zinc in a concentration of $3.0 \times 10^{17}$ cm$^{-3}$ in GaAs had a thickness of 400 nm. Further, in the zinc-doped p-type clad layer, a n-type current blocking layer was formed by etching an opening having a width of 150 μm for injecting a current in a stripe shape using a mixed acid of sulfuric acid and hydrogen peroxide solution after forming a precursor layer of the n-type current blocking layer having a thickness of 450 nm made of GaAs doped with Si as a dopant by an organic metal vapor phase growth method (MOCVD method) so as to cover the entire surface of the zinc-doped p-type first clad layer. At this time, the Si concentration in the n-type current blocking layer was set to $2 \times 10^{18}$ cm$^{-3}$. The zinc-doped p-type second clad layer was formed after forming an opening in the precursor layer of the n-type current blocking layer in a stripe shape. The zinc-doped p-type second clad layer was made of GaAs and was formed with a total thickness of 1750 nm to have a plurality of layers laminated so that a zinc dopant concentration increased from $1.0 \times 10^{18}$ cm$^{-3}$ to $1.1 \times 10^{19}$ cm$^{-3}$ as a distance from the active layer increased. In each layer constituting the plurality of layers, the zinc dopant concentration was constant. Further, the plurality of layers were formed so as to include a layer having a zinc dopant concentration of $1.1 \times 10^{19}$ cm$^{-3}$ and a thickness of 350 nm as a layer having a maximum zinc dopant concentration and separating furthermost from the active layer.

The p-type contact layer was a carbon-doped p-type contact layer obtained by doping carbon as a dopant in GaAs, and was formed with a thickness of 300 nm so that a carbon dopant concentration was $3.0 \times 10^{19}$ cm$^{-3}$. After the p-type contact layer was formed, annealing treatment was performed.

The n-type buffer layer, the n-type semiconductor layer, the active layer, the p-type semiconductor layer, and the p-type contact layer were formed by a MOCVD method. At this time, as a raw material, a required raw material selected from trimethyl gallium (TMG), trimethylaluminum (TMA), trimethyl indium (TMI), arsine gas, halomethane such as carbon bromide (CBr$_4$) or carbon chloride (CCl$_4$), diethyl zinc (DEZ), monosilane ($SiH_4$) and the like might be used according to a material constituting each layer. Thus, a semiconductor optical element forming structure was obtained.

Finally, after the semiconductor optical element forming structure obtained as described above was stuck to an adhesive sheet, the semiconductor optical element forming structure was scratched and cleaved, and the semiconductor optical element having a width of 500 μm and a resonator length of 4 mm was separated so that an opening formed in a stripe shape was located at the center.

Figure 3:
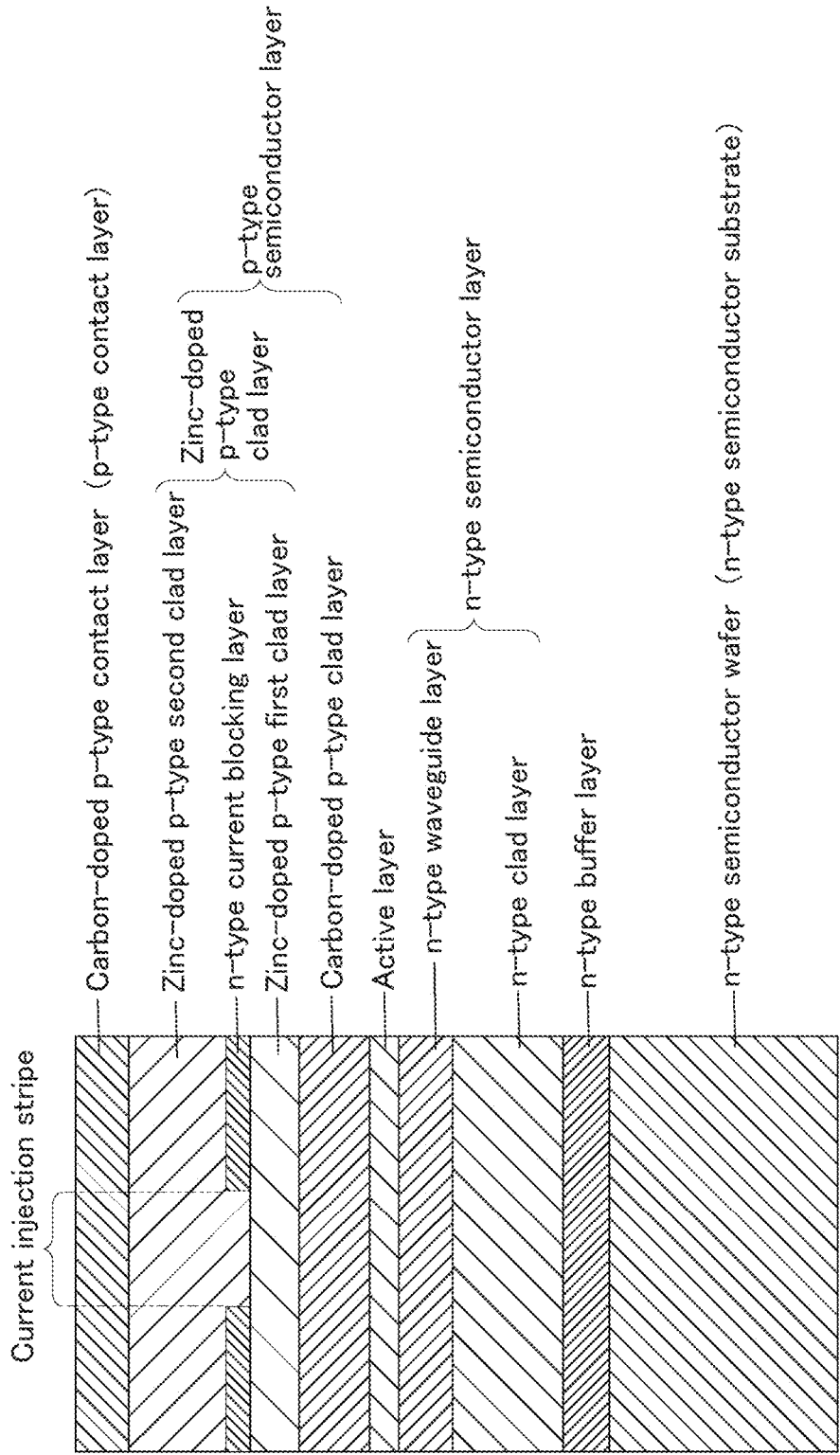
FIG. 3 is a cross-sectional view schematically showing a laminated structure of the semiconductor optical element of Example 1.

Thus, a semiconductor optical element was obtained. A laminated structure of the semiconductor optical element of Example 1 is shown in FIG. 3.

Comparative Example 1

A semiconductor optical element was manufactured in the same manner as in Example 1 except that a carbon-doped p-type clad layer was formed in place of the zinc-doped p-type clad layer. Specifically, the semiconductor optical element was manufactured in the same manner as in Example 1 except that the carbon-doped p-type clad layer was formed in place of the zinc-doped p-type clad layer by changing the dopant from zinc to carbon.

Regarding the semiconductor optical elements of Example 1 and Comparative Example 1 obtained as described above, the surface of the p-type contact layer side was observed by an optical microscope at a magnification of 50 times as an interference image through a Nomarski interference filter. The optical microscope photographs of Example 1 and Comparative Example 1 are shown in FIGS. 4 and 5, respectively.

Figure 4:
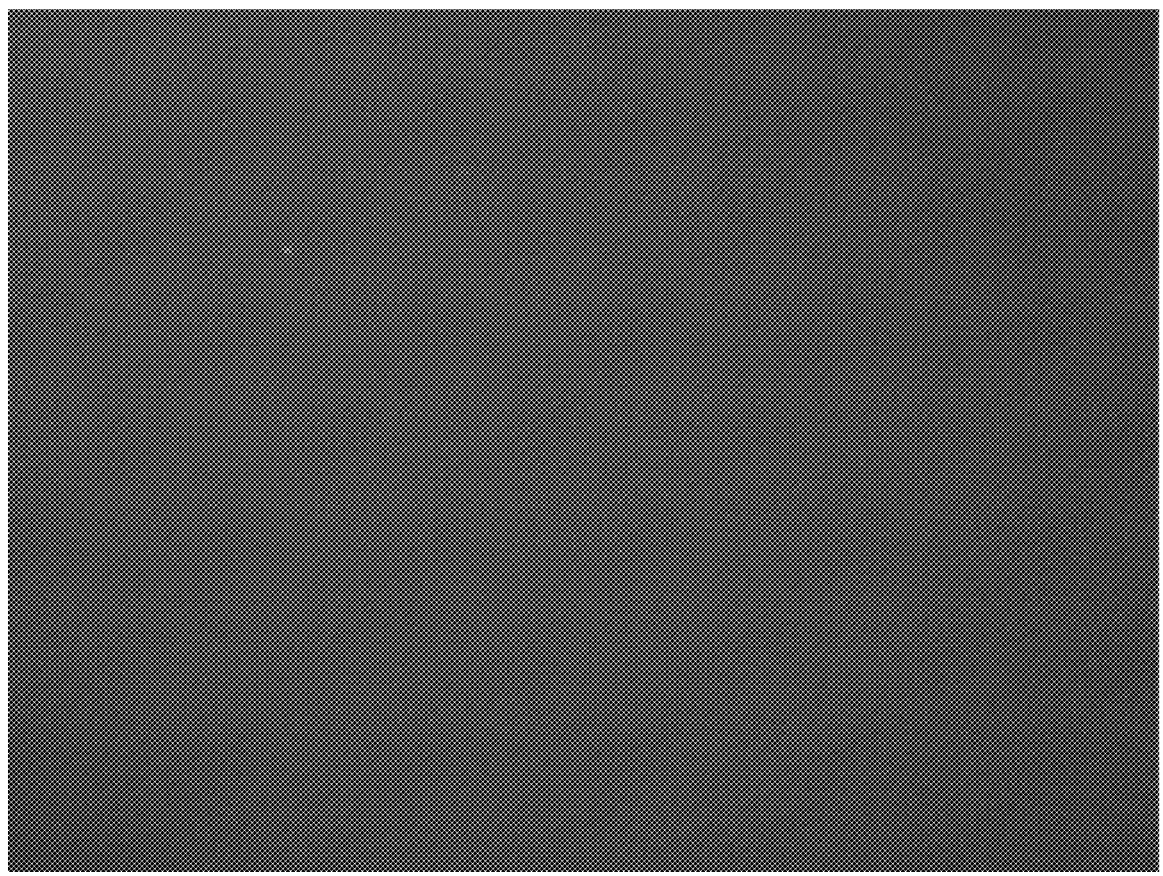
FIG. 4 is an optical microscope photograph showing a surface of a p-type contact layer of the semiconductor optical element of Example 1.
Figure 5:
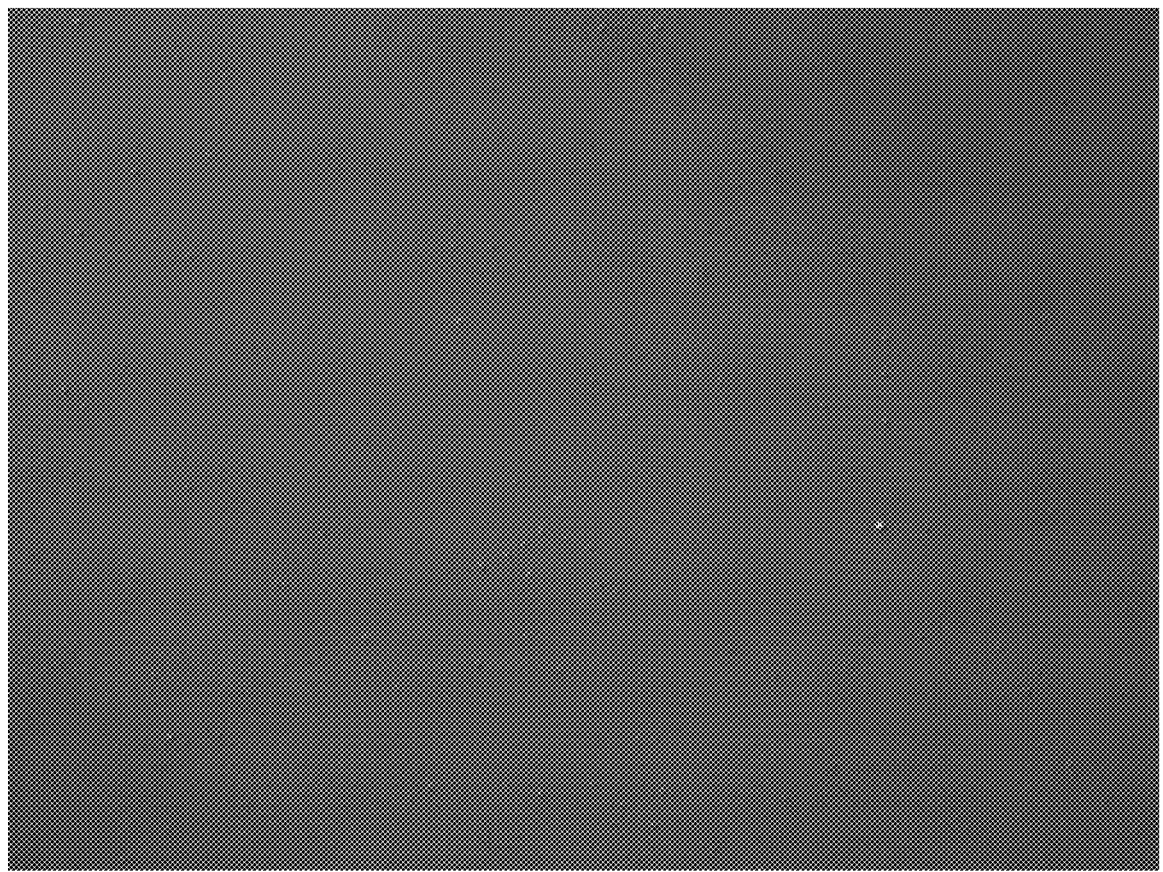
FIG. 5 is an optical microscope photograph showing a surface of a p-type contact layer of the semiconductor optical element of Comparative Example 1.

As shown in FIG. 4, in the semiconductor optical element of Example 1, irregularities such as pits were not observed on the surface of the p-type contact layer. From this, it is considered that there were no irregularities on the surface of the p-type semiconductor layer as well. On the other hand, as shown in FIG. 5, in the semiconductor optical element of Comparative Example 1, cloudiness was seen since there were many irregularities such as pits on the surface of the p-type contact layer.

Therefore, in the semiconductor optical element of Comparative Example 1, roughness was observed on the surface of the p-type semiconductor layer. In contrast, in the semiconductor optical element of Example 1, no roughness was observed on the surface of the p-type semiconductor layer. That is, there was no surface roughness. Therefore, the semiconductor optical element of Example 1 is considered to improve the crystallinity of the p-type semiconductor layer.

Examples 2 to 7

Semiconductor optical elements were manufactured in the same manner as in Example 1 except that the zinc dopant concentration in the layer having the maximum zinc dopant concentration and separating furthermost from the active layer of the zinc-doped p-type second clad layer was set to $2.0 \times 10^{18}$ $cm^{-3}$, $5.0 \times 10^{18}$ $cm^{-3}$, $8.0 \times 10^{18}$ $cm^{-3}$, $1.5 \times 10^{19}$ $cm^{-3}$, $2.0 \times 10^{19}$ $cm^{-3}$ or $3.0 \times 10^{19}$ $cm^{-3}$, respectively as shown in Table 1.

In the semiconductor optical elements of Examples 2 to 7 as well, the surfaces of the p-type contact layer side were observed in the same manner as in the semiconductor optical element of Example 1. The results are shown in Table 1. As a result, all of the semiconductor optical elements of Examples 2 to 7 exhibited the same results as those of Example 1 in terms of surface roughness. Further, regarding the semiconductor optical elements of Examples 2 to 7, an electrode was formed by a metal vapor deposition film on the outermost surface of the n-type semiconductor layer and the p-type semiconductor layer to inject a current into the semiconductor optical element. Next, a n-side electrical junction and a p-side electrical junction for bonding to the n-type semiconductor layer and the p-type semiconductor layer were formed on a submount for radiating heat generated in accompany with laser oscillation of the semiconductor optical element, respectively. Thereafter, the semiconductor optical element was mounted on the submount by using solder and a wire. At this time, the n-type semiconductor layer was bonded to the n-side electrical junction, and the p-type semiconductor layer was bonded to the p-side electrical junction. A current was injected from a power source to the semiconductor optical element mounted on the submount through the electrical junction, and a resistance value and a threshold current were measured. The results are shown in Table 1. However, in Table 1, the resistance values and the threshold current values of the semiconductor optical elements of Examples 2 to 7 were shown by relative values with the resistance value and the threshold current value of the semiconductor optical element of Example 1 being 100. As shown in Table 1, a semiconductor optical element having a resistance value of less than +10% or a threshold current value of less than +6% to the resistance value or the threshold current value of Example 1 was expressed as "A", and a semiconductor optical element having a resistance value of +10% or more or a threshold current value of +6% or more was expressed as "B". In addition, since the resistance value and the threshold current value of Example 1 were expressed as "—" since they were the references of the resistance values and the threshold current values of Examples 2 to 7.

As shown in Table 1, the semiconductor optical elements of Examples 3 to 5 showed results in which resistance values or threshold current values further improved as compared with the semiconductor optical elements of Examples 2, 6, and 7. From the results, it was found that a zinc dopant concentration may be $5.0 \times 10^{18}$ $cm^{-3}$ to $1.5 \times 10^{19}$ $cm^{-3}$ in the layer having a maximum dopant concentration and separating furthermost from the active layer of the zinc-doped p-type second clad layer.

TABLE 1

| | Example 1 | Example 2 | Example 3 | Example 4 | Example 5 | Example 6 | Example 7 |
|---|---|---|---|---|---|---|---|
| Zn dopant concentration ($cm^{-3}$) | $1.1 \times 10^{19}$ | $2.0 \times 10^{18}$ | $5.0 \times 10^{18}$ | $8.0 \times 10^{18}$ | $1.5 \times 10^{19}$ | $2.0 \times 10^{19}$ | $3.0 \times 10^{19}$ |
| Surface roughness | none | none | none | none | none | none | none |
| Threshold current value (Example 1 = 100) | 100 | 101 | 100 | 100 | 102 | 107 | 137 |
| Resistance value (Example 1 = 100) | 100 | 121 | 103 | 79 | 93 | 90 | 72 |
| Evaluation | — | B | A | A | A | B | B |

Example 8

Figure 6:
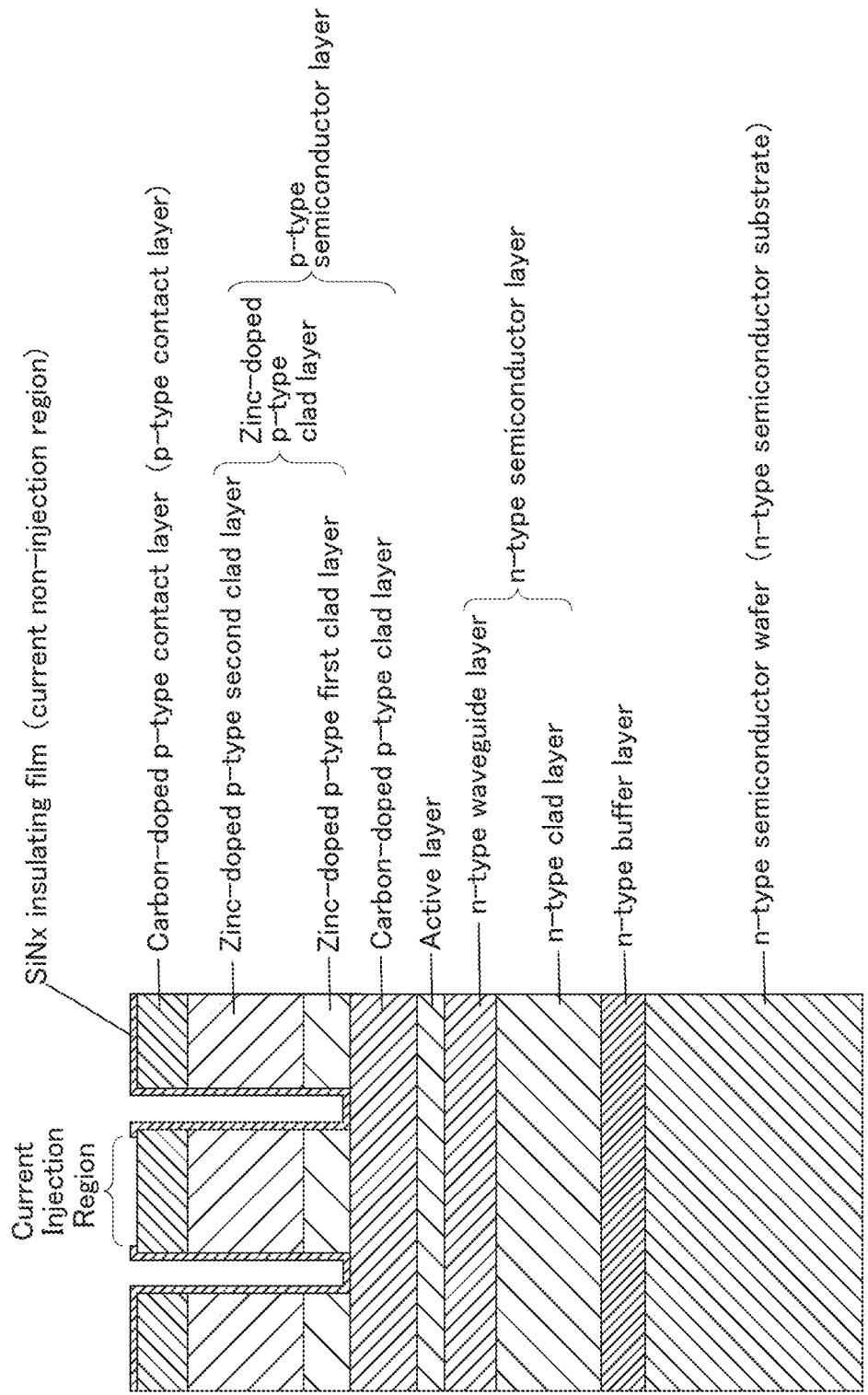
FIG. 6 is a cross-sectional view schematically showing a laminated structure of the semiconductor optical element of Example 8.

A semiconductor optical element having the same structure as that of the semiconductor optical element of Example 1 was manufactured except that a current injection stripe formed by the n-type current blocking layer made of Si-doped GaAs in Example 1 was changed to a ridge structure having a current non-injection region formed of an insulating film as follows (see FIG. 6). Specifically, after the same laminated structure as that of Example 1 except for the n-type current blocking layer was grown by the MOCVD method, a p-type contact layer and a zinc-doped p-type first clad layer were removed by a mixed acid composed of tartaric acid and hydrogen peroxide solution to form a convex portion (mesa) having a width of 150 μm corresponding to the current injection region. The widths of the removed portions due to etching on both sides of the convex portion were set to be 40 μm. Thereafter, an insulating film made of SiNx was grown on a portion other than the current injection region to form a current non-injection region. A semiconductor optical element having a ridge structure having a current non-injection region was manufactured as described above. With respect to the semiconductor optical element, surface observation on the p-type contact layer side was performed in the same manner as in Example 1. As a result, the same results as those of Example 1 were obtained.

Accordingly, it has been found that the present invention was effective in a semiconductor optical element of not only a current stripe structure formed from a current blocking layer but also a ridge structure having a current non-injection region.

Example 9

A semiconductor optical element was manufactured in the same manner as in Example 1 except that the quantum well layer in the active layer was formed of GaAs instead of InGaAs. With respect to the semiconductor optical element, surface observation on the p-type contact layer side was performed in the same manner as in Example 1. As a result, the same results as those of Example 1 were obtained.

Accordingly, it has been found that the present invention is effective not only in a semiconductor optical element in which the material of the quantum well is InGaAs but also GaAs.

Thus, it is considered that the semiconductor optical element of the present invention can improve light emission characteristics.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

REFERENCE SIGNS LIST

10 N-type semiconductor substrate (first conductivity type semiconductor substrate)
20 Laminated body
30 N-type semiconductor layer (first conductivity type semiconductor layer)
40 Active layer
50 P-type semiconductor layer (second conductivity type semiconductor layer)
51 Carbon-doped p-type clad layer (carbon-doped second conductivity type semiconductor layer)
52 Group 2 element-doped p-type clad layer (group 2 element-doped second conductivity type semiconductor layer)
60 P-type contact layer (second conductivity type contact layer)
100 Semiconductor optical element
200 Semiconductor optical element forming structure
210 N-type semiconductor wafer (first conductivity type semiconductor wafer)
220 Laminated body

What is claimed is:

1. A semiconductor optical element, comprising:
a first conductivity type semiconductor substrate; and
a laminated body disposed on the first conductivity type semiconductor substrate, wherein the laminated body comprises, in the following order from a side of the first conductivity type semiconductor substrate:
a first conductivity type semiconductor layer;
an active layer;
a second conductivity type semiconductor layer; and
a second conductivity type contact layer, wherein
the second conductivity type semiconductor layer comprises:
a carbon-doped semiconductor layer in which carbon is doped as a dopant in a compound semiconductor; and
a group 2 element-doped semiconductor layer in which a group 2 element is doped as a dopant in a compound semiconductor, wherein
the carbon-doped semiconductor layer is disposed at a position closer to the active layer than the group 2 element-doped semiconductor layer, and
the group 2 element-doped semiconductor layer comprises a graded layer in which a concentration of the dopant increases as a distance from the active layer increases.

2. The semiconductor optical element according to claim 1, wherein the second conductivity type contact layer comprises a carbon-doped contact layer in which carbon is doped as a dopant in a compound semiconductor.

3. The semiconductor optical element according to claim 2, wherein a concentration of the dopant in the second conductivity type contact layer is higher than a concentration of the dopant in the carbon-doped semiconductor layer.

4. The semiconductor optical element according to claim 1, wherein a ratio of a thickness of the group 2 element-doped semiconductor layer to a thickness of the second conductivity type semiconductor layer is greater than 50% and less than 100%.

5. The semiconductor optical element according to claim 1, wherein a maximum concentration of the dopant in the group 2 element-doped semiconductor layer is larger than a maximum concentration of the dopant in the carbon-doped semiconductor layer.

6. The semiconductor optical element according to claim 1, wherein the second conductivity type semiconductor layer and the second conductivity type contact layer each comprises:
a current injection region; and
current non-injection regions that are disposed on both sides of the current injection region and each of which comprises a groove along the current injection region.

7. A semiconductor optical element forming structure, comprising:
   a first conductivity type semiconductor wafer; and
   a laminated body on the first conductivity type semiconductor wafer, wherein the laminated body comprises, in the following order from a side of the first conductivity type semiconductor wafer:
      a first conductivity type semiconductor layer;
      an active layer;
      a second conductivity type semiconductor layer; and
      a second conductivity type contact layer, wherein
      the second conductivity type semiconductor layer comprises:
         a carbon-doped semiconductor layer in which carbon is doped as a dopant in a compound semiconductor; and
         a group 2 element-doped semiconductor layer in which a group 2 element is doped as a dopant in a compound semiconductor, wherein
         the carbon-doped semiconductor layer is disposed at a position closer to the active layer than the group 2 element-doped semiconductor layer, and
         the group 2 element-doped semiconductor layer comprises a graded layer where a concentration of the dopant increases as a distance from the active layer increases.

8. The semiconductor optical element forming structure according to claim 7, wherein the second conductivity type contact layer comprises a carbon-doped contact layer in which carbon is doped as a dopant in a compound semiconductor.

9. The semiconductor optical element forming structure according to claim 8, wherein a concentration of the dopant in the second conductivity type contact layer is higher than a concentration of the dopant in the carbon-doped semiconductor layer.

10. The semiconductor optical element forming structure according to claim 7, wherein a ratio of a thickness of the group 2 element-doped semiconductor layer to a thickness of the second conductivity type semiconductor layer is greater than 50% and less than 100%.

11. The semiconductor optical element forming structure according to claim 7, wherein a maximum concentration of the dopant in the group 2 element-doped semiconductor layer is larger than a maximum concentration of the dopant in the carbon-doped semiconductor layer.

12. The semiconductor optical element forming structure according to claim 7, wherein the second conductivity type semiconductor layer and the second conductivity type contact layer each comprises:
   a current injection region; and
   current non-injection regions that are disposed on both sides of the current injection region and each of which comprises a groove along the current injection region.

13. A method of manufacturing a semiconductor optical element, the method comprising:
   preparing a semiconductor optical element forming structure according to claim 7; and
   forming the semiconductor optical element from the semiconductor optical element forming structure, wherein
   the preparing of the semiconductor optical element forming structure comprises:
      forming the second conductivity type semiconductor layer on the active layer; and
      forming the second conductivity type contact layer on the second conductivity type semiconductor layer, and
   the forming of the second conductivity type semiconductor layer on the active layer comprises:
      forming the carbon-doped semiconductor layer on the active layer; and
      forming the second conductivity type semiconductor layer by forming the group 2 element-doped semiconductor layer on the carbon-doped semiconductor layer, wherein
      in the forming of the group 2 element-doped semiconductor layer, the group 2 element-doped semiconductor layer is formed such that the group 2 element-doped semiconductor layer comprises a graded layer in which a concentration of the dopant increases as a distance from the active layer increases.

14. The method according to claim 13, wherein the forming of the second conductivity type contact layer comprises forming a carbon-doped contact layer in which carbon is doped as a dopant in a compound semiconductor as the second conductivity type contact layer on the second conductivity type semiconductor layer.

15. The method according to claim 14, wherein, in the forming of the second conductivity type contact layer, the second conductivity type contact layer is formed such that a concentration of the dopant in the second conductivity type contact layer is higher than a concentration of the dopant in the carbon-doped semiconductor layer.

16. The method according to claim 13, further comprising:
   forming a current injection region and current non-injection regions, wherein
   the current non-injection regions are disposed on both sides of the current injection region and each comprise a groove along the current injection region in the second conductivity type semiconductor layer and the second conductivity type contact layer.

* * * * *